United States Patent
Joshi et al.

(10) Patent No.: US 8,588,009 B2
(45) Date of Patent: Nov. 19, 2013

(54) CIRCUIT FOR MEMORY CELL RECOVERY

(75) Inventors: Rajiv V. Joshi, Yorktown Heights, NY (US); Rouwaida N. Kanj, Round Rock, TX (US); Jente B. Kuang, Austin, TX (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 79 days.

(21) Appl. No.: 13/247,362

(22) Filed: Sep. 28, 2011

(65) Prior Publication Data

US 2013/0077415 A1   Mar. 28, 2013

(51) Int. Cl.
*G11C 7/00* (2006.01)
(52) U.S. Cl.
USPC ..................... 365/189.14; 365/205
(58) Field of Classification Search
USPC ............................ 365/189.14, 205
See application file for complete search history.

(56) References Cited

U.S. PATENT DOCUMENTS

| | | | |
|---|---|---|---|
| 7,310,281 B1 | 12/2007 | Hsueh et al. | |
| 7,391,232 B1 | 6/2008 | Bose et al. | |
| 7,447,054 B2 | 11/2008 | Abella et al. | |
| 2007/0268748 A1* | 11/2007 | Lee et al. | 365/185.08 |
| 2010/0046276 A1 | 2/2010 | Chen et al. | |
| 2010/0193761 A1* | 8/2010 | Amin et al. | 257/4 |
| 2011/0149631 A1* | 6/2011 | Scheuerlein et al. | 365/100 |

OTHER PUBLICATIONS

Sanjay V. Kumar et al. "Impact of NBTI on SRAM Read Stability and Design for Reliability," 7th International Symposium on Quality Electronic Design, 2006. ISQED '06, pp. 1-6, Mar. 27-29, 2006.
Stephen Ramey et al. "Frequency and recovery effects in high-κ BTI degradation," 2009 IEEE International Reliability Physics Symposium, pp. 1023-1027, Apr. 26-30, 2009.
U.S. Appl. No. 13/915,913, entitled "Circuit for Memory Cell Cata Recovery" filed Jun. 13, 2013.

* cited by examiner

*Primary Examiner* — Michael Tran
(74) *Attorney, Agent, or Firm* — Trentice V. Bolar; John D. Flynn; Jason H. Sosa (57) ABSTRACT

An apparatus and method for combating the effects of bias temperature instability (BTI) in a memory cell. Bit lines connecting to a memory cell contain two alternate paths crisscrossing to connect a lower portion of a first bit line to an upper portion of a second bit line, and to connect a lower portion of the second bit line to an upper portion of the first bit line. Alternative to activating transistors on the bit lines to read and write to the memory cell, transistors on the alternative paths may be activated to read and write to the memory cell from the opposite bit lines. The memory cell may be read through the bit lines to a sense amplifier, the transistors on the bit lines are subsequently deactivated and the transistors on the alternate paths are activated to write transposed bit values to the memory cell, thereby reversing the biases.

11 Claims, 7 Drawing Sheets

CIRCUIT FOR MEMORY CELL RECOVERY

FIELD OF THE INVENTION

The present invention relates generally to improvements in lifetime reliability of semiconductor devices and, more particularly, to circuits and the use of the circuits to allow for devices within a memory cell to recover from variability, biases, and stresses.

BACKGROUND OF THE INVENTION

A memory cell, comprised of a number of transistors, operates by holding a voltage value over a period of time. This value translates to either a "1" (high voltage) or a "0" (low voltage) during a read operation of the memory. Constant voltage stress can lead to rapid degeneration of transistor parameters, such as threshold voltage and source-drain current. These effects are known as bias temperature instability (BTI) and become more pronounced and destructive as device sizes are reduced. BTI can be either negative BTI (NBTI) when the bias voltage is negative on a metal-oxide-semiconductor (MOS) structure or positive BTI (PBTI) when the bias voltage is positive. The NBTI effect is more severe for P-channel MOS (PMOS) transistors and the PBTI effect is more severe for N-channel MOS (NMOS) transistors. BTI degrades the reliability of MOS transistors due to the change in threshold voltage, and the degradation increases at elevated temperatures. However, if the stress is periodically interrupted or reversed, the degradation may be significantly reduced, extending the projected life time of the MOS transistors.

A conventional six-transistor static random access memory (SRAM) cell consists of two PMOS transistors and four NMOS transistors. With any data storage in the SRAM cell, the effects of NBTI degrade one of the PMOS transistors and the effects of PBTI degrade one of the NMOS transistors. If the same data is stored in the SRAM memory cell for an extended period of time, then there can be substantial degradation on the PMOS transistor and the NMOS transistor. During the operation of the SRAM, even if the data read and write operations are performed frequently with different data contents, there is a good possibility that some of the SRAM memory cells store the same high state or low state for an extended period of time. Again, these non-refreshed memory cells can have higher degradation in one of the PMOS transistors and one of the NMOS transistors which can decrease the reliability of the SRAM cell, as well as the life-time of the entire SRAM memory.

To combat these effects, a recovery period where the polarity of the memory cell is reversed (and hence the biases in the transistors) can be successful. Current strategies to reverse the polarity include the use of at least one inverter and data drivers to re-write the opposite values to the memory cell.

SUMMARY

One aspect of the present invention discloses an apparatus for reading and writing inverted bit values to a memory cell. The apparatus comprises a memory cell, which comprises a first node with one or more field-effect transistors (FETs) and capable of storing a first bit value, and a second node with one or more FETs and capable of storing a second bit value. The apparatus further comprises a first bit line coupled to the memory cell and corresponding to the first node of the memory cell, and a second bit line coupled to the memory cell and corresponding to the second node of the memory cell. A FET exists on the first bit line that, when activated, provides a path from a first section of the first bit line to a second section of the first bit line, the first section of the first bit line being closer to the memory cell than the second section of the first bit line. A FET exists on the second bit line that, when activated, provides a path from a first section of the second bit line to a second section of the second bit line, the first section of the second bit line being closer to the memory cell than the second section of the second bit line. A first alternative line connects the first section of the first bit line to the second section of the second bit line, the first alternative line being selectable by activating a FET on the first alternative line. A second alternative line connects the first section of the second bit line to the second section of the first bit line, the second alternative line being selectable by activating a FET on the second alternative line.

A second aspect of the present invention discloses a method for extending lifetime reliability of a memory cell. The method comprises providing a first and second read and write (R/W) path connecting the memory cell to a sense amplifier, wherein one of the first and second R/W paths comprises a first conductive line connecting a first node of the memory cell to a first node of the sense amplifier and a second conductive line connecting a second node of the memory cell to a second node of the sense amplifier, and an other of the first and second R/W paths comprises a first conductive line connecting the first node of the memory cell to the second node of the sense amplifier and a second conductive line connecting the second node of the memory cell to the first node of the sense amplifier, wherein the respective first and second nodes of the memory cell and the sense amplifier are each capable of storing a bit value. The method further comprises activating the first R/W path and precharging the first and second conductive lines of the first R/W path. The method activates a word line corresponding to the memory cell to read the bit values of the first and second node of the memory cell onto the first and second conductive lines of the first R/W path. The method provides a voltage to the sense amplifier to latch in the bit values on the first and second conductive lines of the first R/W path into the first and second nodes of the sense amplifier. The method subsequently deactivates the word line and deactivates the first R/W path. The method keeps the sense amplifier activated to hold data. The method activates the second R/W path and reads the bit values on the first and second nodes of the sense amplifier onto the first and second conductive lines of the second R/W path. Finally, the method activates the word line again to write the bit values on the first and second conductive lines of the second R/W path into the respective first and second nodes of the memory cell to enter a recovery state.

Once the cell is in recovery state (holding inverse data), it is possible to rely on the same infrastructure to read the true data by activating the second R/W path during the read cycle. In a similar fashion, if there is a need to write the inverse of data to a cell in the recovery mode group, then the second R/W path can be used to pass the inverse data to the cell.

A third aspect of the present invention discloses a method for writing to a memory cell without the need for data drivers. The method provides a first and second read and write (R/W) path to the memory cell. The first R/W path comprises a first bit line coupled to the memory cell and corresponding to a first node of the memory cell, a second bit line coupled to the memory cell and corresponding to a second node of the memory cell, a FET on the first bit line that, when activated, provides a path from a first section of the first bit line to a second section of the first bit line, the first section of the first bit line being closer to the memory cell than the second section of the first bit line, and a FET on the second bit line that when activated provides a path from a first section of the second bit line to a second section of the second bit line, the first section of the second bit line being closer to the memory cell than the second section of the second bit line. The second R/W path comprises a first alternative line connecting the first section of the first bit line to the second section of the second bit line, the first alternative line being selectable by activating a FET on the first alternative line, and a second alternative line connecting the first section of the second bit line to the second section of the first bit line, the second alternative line being selectable by activating a FET on the second alternative line. The method provides a first conductive line connecting to the second section of the first bit line operational via a FET on the first conductive line and a second conductive line connecting the second section of the second bit line and operational via a FET on the second conductive line, wherein one of the first and second conductive lines accesses a high voltage when activated and an other of the first and second line accesses a low voltage when activated. The method determines a logic value to be written to the memory cell. The method activates the respective FETs on the first and second conductive lines. Subsequently, the method activates one of the first and second R/W paths based on the logic value. Finally, the method activates a word line corresponding to the memory cell to write values associated with the high and low voltages into the first and second node of the memory cell.

A fourth aspect of the present invention discloses a method for selectively reading a node of a memory cell in a single-ended read. The method provides a column of one or more memory cells, each respective memory cell comprising a first and second node, each of the first and second nodes maintaining an opposite bit value. The method provides a bit line connecting each respective first node to a single-ended sense amplifier, the bit line being accessible via a FET on the bit line. The method provides an alternate line connecting each respective second node of the one or more memory cells to the single-ended sense amplifier, the alternate line being accessible via a FET on the alternate line. The method determines a read delay for each of the respective first nodes. If, for a given node from the respective first nodes, the read delay is greater than a threshold read delay, the method performs subsequent read and write requests via the alternate line to improve performance.

BRIEF DESCRIPTION OF THE SEVERAL VIEWS OF THE DRAWINGS

FIGS. 5 and 6 illustrate exemplary data flow using the additional circuitry, wherein

DETAILED DESCRIPTION

The present invention discloses a recovery method and design for semiconductor memories having at least one PMOS transistor and/or at least one NMOS transistor in its memory cell. A conventional six-transistor static random access memory (SRAM) is one such memory.

Figure 1:
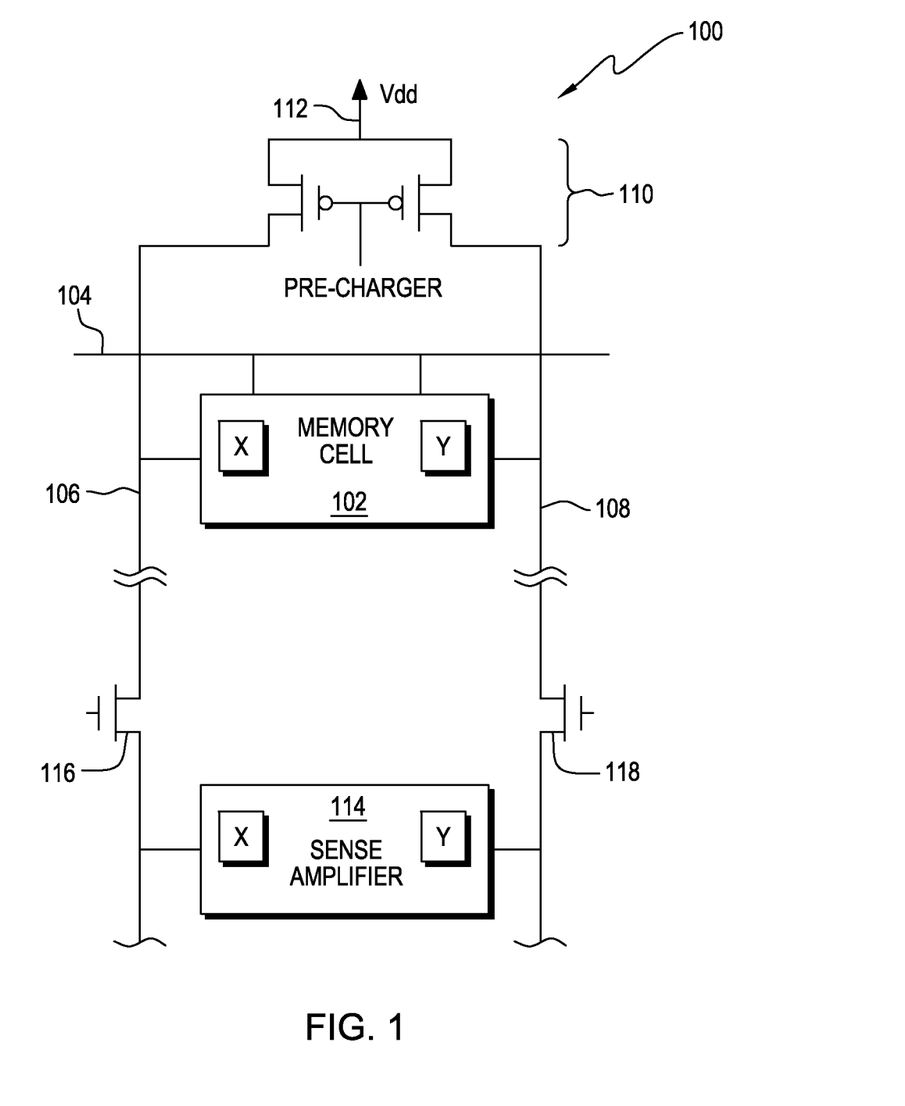
FIG. 1 depicts a standard circuit configuration for a SRAM memory cell and sense amplifier in which embodiments of the present invention may be implemented.

FIG. 1 depicts a standard circuit configuration for a SRAM memory cell and sense amplifier in which embodiments of the present invention may be implemented.

Figure 2:
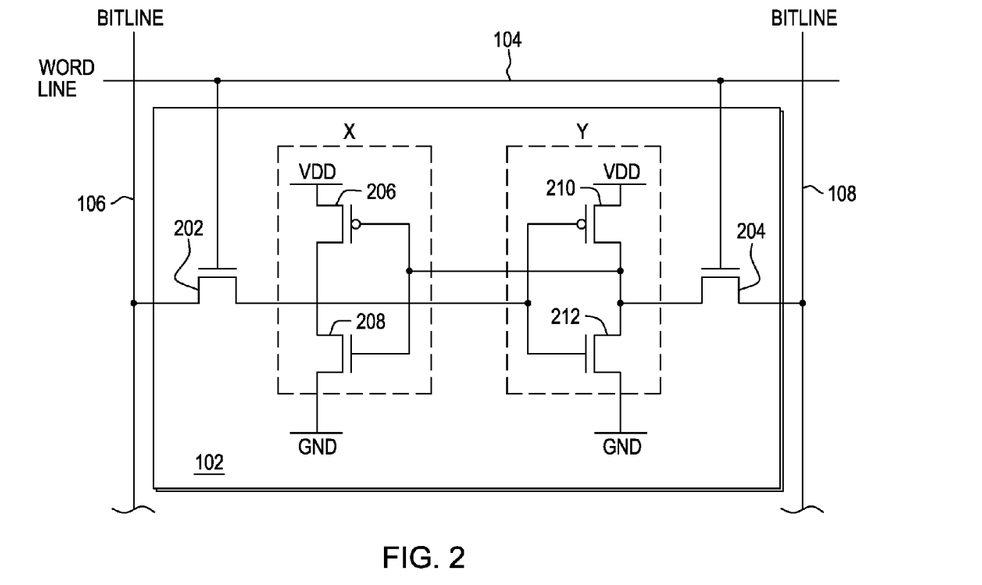
FIG. 2 illustrates a transistor circuit representation for a memory cell in accordance with an embodiment of the present invention.

Circuit configuration 100 contains memory cell 102. Memory cell 102 maintains two opposite logic values X and Y, each of which may be either a '1' (high voltage) or a '0' (low voltage). Memory cell 102 comprises two back-to-back inverters forming a flip-flop configuration, each inverter producing one of the two logic values. These inverters may also be referred to as nodes, with each node storing a value. The inner circuitry of memory cell 102 is shown in FIG. 2.

Memory cell 102 is accessible by pass transistors within the memory cell 102 connected to word line 104. Word line 104 may also be referred to as the row select line. While memory cell 102 is accessed by word line 104, memory cell 102 can be written into or read out from bit lines 106 and 108. A number of like memory cells may be arranged in an array of rows and columns. Typically, each row has a common word line and each column has common bit lines. "Lines" refer to any conductive path or circuitry.

Input data to be written to memory cell 102 is placed on bit lines 106 and 108. One bit line is set to true and the other as the inverse. For purposes of discussion, bit line 106 is assigned the true value and bit line 108 is assigned the inverse. To write '0', bit line 106 is set to '0' and bit line 108 is set to '1'. To write '1', bit line 106 is set to '1' and bit line 108 is set to '0'. When word line 104 is activated, logic values X and Y pick up the logic values from bit lines 106 and 108.

To read memory cell 102, bit lines 106 and 108 must be pre-charged to logic value '1'. In one embodiment, precharge circuit 110 comprises a PMOS transistor for each of bit lines 106 and 108. When the precharge signal is activated, bit lines 106 and 108 are connected to power source (Vdd) 112 to charge bit lines 106 and 108 up to Vdd. When word line 104 is activated, the bit line connected to the '0' logic value within memory cell 102 will discharge to logic '0' (referred to as pulling down to 0).

To capture the logic values on bit lines 106 and 108, sense amplifier 114 connects to bit lines 106 and 108 through column select transistors 116 and 118. The circuits of sense amplifier 114 (described in FIG. 3) implement a cross-coupled inverter arrangement similar to that used in memory cell 102. Sense amplifier 114 latches in the required state until the memory cell 102 has been read. Following a successful read, sense amplifier 114 can be deactivated.

FIG. 2 illustrates a transistor circuit representation for memory cell 102 in accordance with an embodiment of the invention.

Pass transistors 202 and 204, also referred to as access transistors, are connected to the word line and when activated provide access (reading and writing) to memory cell 102. When memory 102 is not selected (pass transistors 202 and 204 are not activated), the two inverters, depicted as node X and node Y, feed back on each other to reinforce the stored data. Each inverter comprises a PMOS transistor and a NMOS transistor. In the depicted example, node X comprises PMOS 206 and NMOS 208, and node Y comprises PMOS 210 and NMOS 212. On a "write" operation, each respective node will pick up the logic value of the associated bit line.

Figure 3:
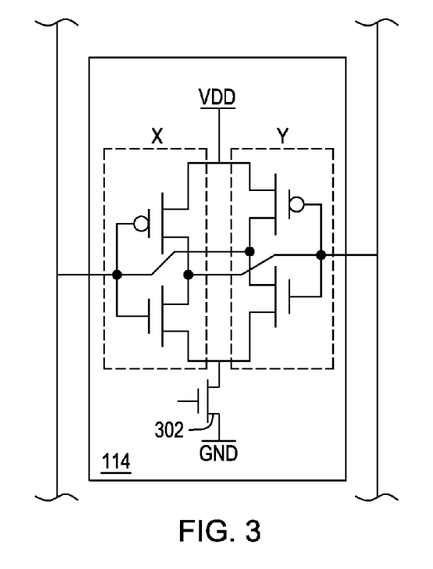
FIG. 3 illustrates a transistor circuit representation for a sense amplifier in accordance with an embodiment of the present invention.

FIG. 3 illustrates a transistor circuit representation for sense amplifier 114 in accordance with an embodiment of the invention.

NMOS 302 is activated by a high logic ('1') turning on sense amplifier 114. As long as NMOS 302 is on, sense amplifier 114 latches (stores) the values received from the bit lines. Similar to circuitry in memory cell 102, sense amplifier 114 stores values in an X and Y node comprised of a PMOS and a NMOS transistor, and the nodes feed back on each other to reinforce the stored data.

Figure 4A:
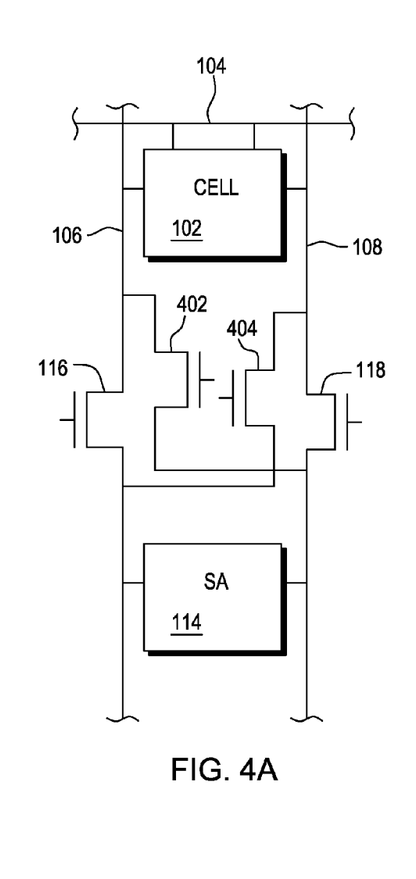
FIG. 4A depicts additional circuitry to affect cell recovery in accordance with an embodiment of the present invention.

FIG. 4A depicts additional circuitry to affect cell recovery in accordance with an embodiment of the present invention.

While typically column select transistors 116 and 118 provide a direct path from one side of memory cell 102 to the corresponding side in sense amplifier 114, additional BTI recovery (BTIR) transistors 402 and 404 are added as alternative paths from one side of sense amplifier 114 to the opposite bit line.

Figure 4B:
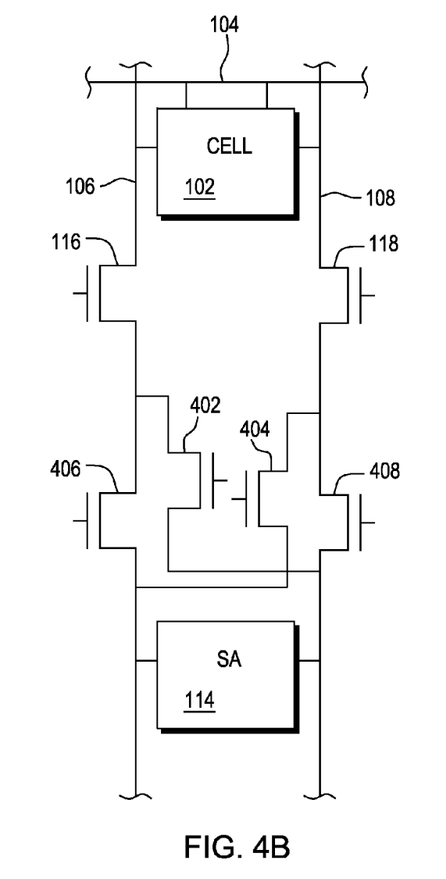
FIG. 4B depicts an alternative circuitry to affect cell recovery.

FIG. 4B depicts an alternative circuitry to affect cell recovery. In the depicted example, BTIR transistors 402 and 404 continue to provide an alternate transposing path. Additionally, standard path transistors 406 and 408 connect sense amplifier 114 to the traditional bit lines. In this manner, a selection may be made between the standard bit line path and the alternate transposing path independent of the column selection controlled by column select transistors 116 and 118. This embodiment allows shared use of the BTIR transistors among different columns of cells.

Figure 5:
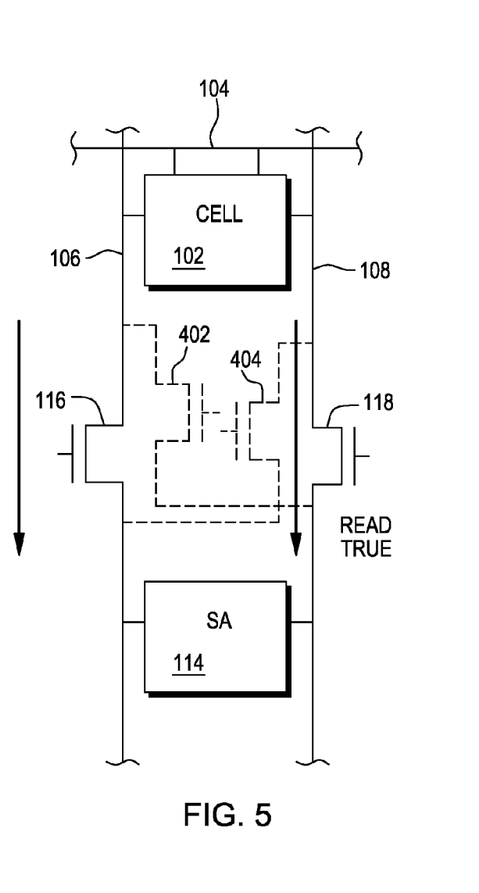
FIG. 5 shows a standard read of values stored in a memory cell to a sense amplifier using column select transistors.
Figure 6:
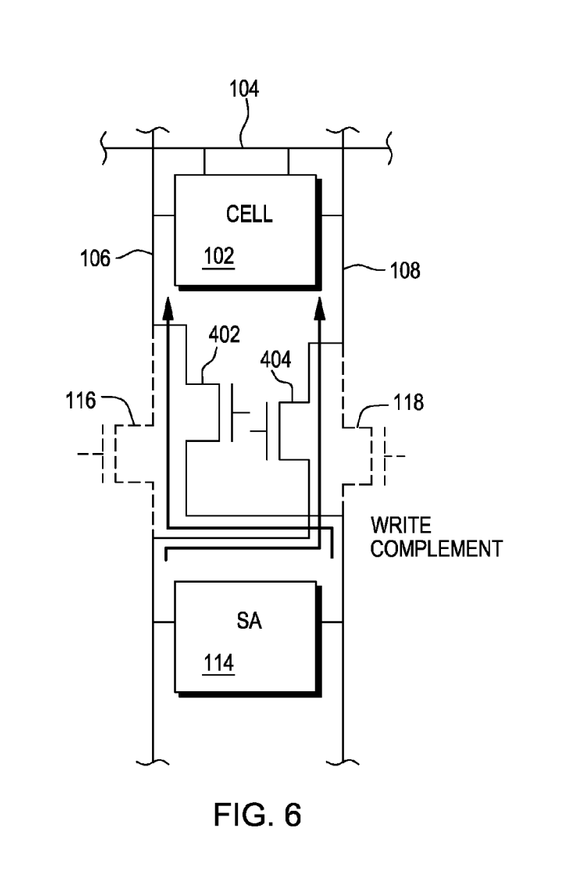
FIG. 6 depicts the writing process that writes back the inverse values stored in the memory cell, allowing it to recover.

FIGS. 5 and 6 illustrate exemplary data flow using the additional circuitry. FIG. 5 shows a standard read of values from X and Y of memory cell 102 to sense amplifier 114 using column select transistors 116 and 118. BTIR transistors 402 and 404 are deactivated during the read. FIG. 6 depicts a writing process that inverses the values stored in X and Y of memory cell 102, allowing it to recover. Subsequent to reading the values into sense amplifier 114, column select transistors 116 and 118 are deactivated and BTIR transistors 402 and 404 are selected to allow the latched values in sense amplifier 114 to write to the opposite bit lines and hence transpose the values of X and Y stored in memory cell 102 without the use of an inverter or data drivers. The transposed values on bit lines 106 and 108 are written to memory cell 102 by activating word line 104. A memory cell where the values of X and Y have been transposed may be referred to as an "inverted" or "transposed" cell. In an alternative embodiment, when transposing the values of X and Y in memory cell 102, the read may be done by selecting BTIR transistors 402 and 404, thereby latching the opposite values in sense amplifier 114 and writing back to memory cell 102 on the standard path via column select transistors 116 and 118 and activating word line 104. The standard lines and the transposing lines may be referred to as alternate read/write (R/W) paths.

In a preferred embodiment, after memory cell 102 has been transposed, access to the cell, or perhaps the entire column of cells, is frozen, allowing memory cell 102, and any other cells transposed in the column, to recover for a period of time. A person skilled in the art will recognize that if it became desirable or necessary to read or write to memory cell 102 while in this recovery state, the proper data may be inputted and received by reading and writing the data through BTIR transistors 402 and 404, hence reading and writing true data out of the inverted cell.

Figure 7:
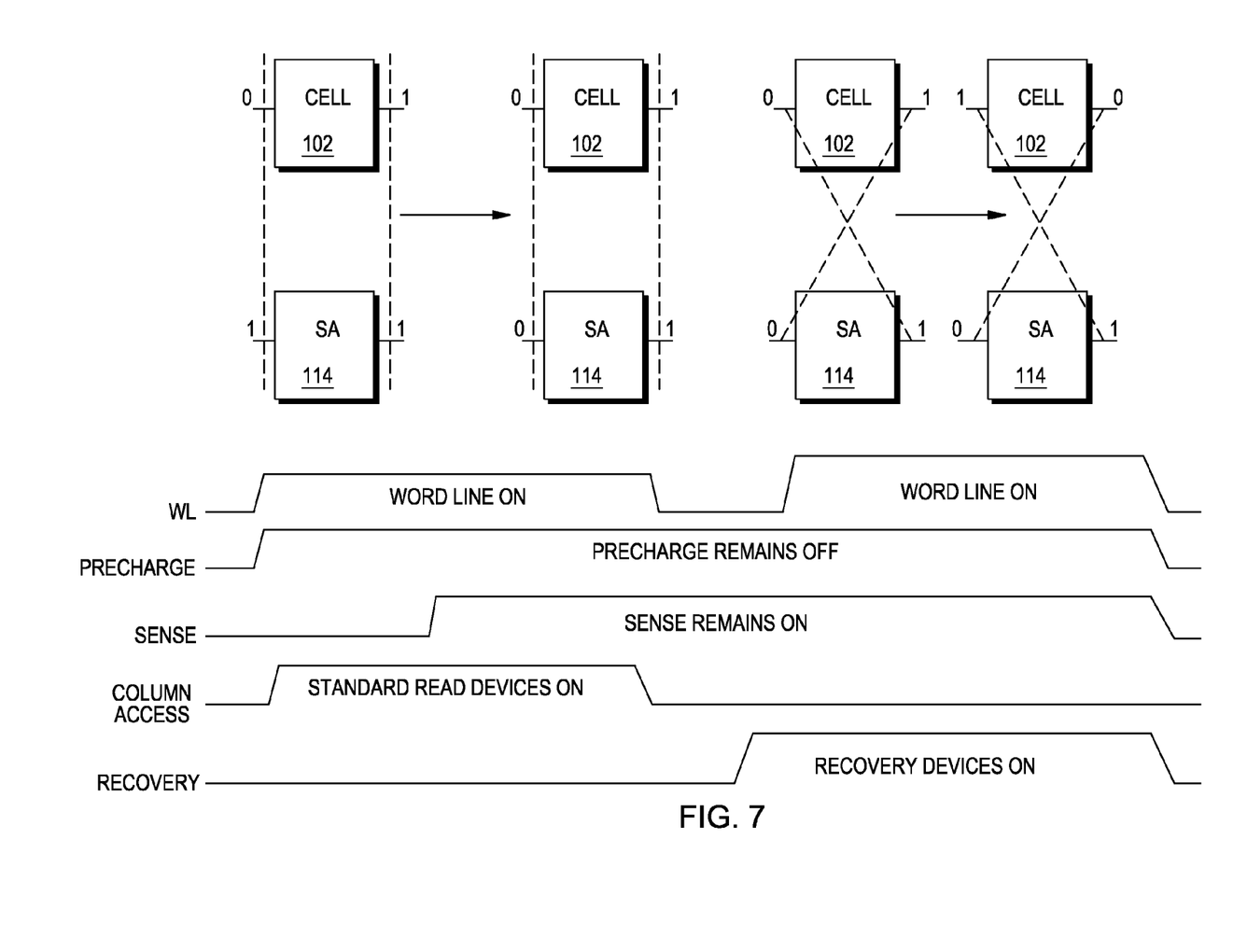
FIG. 7 depicts the process and line charges to implement the recovery process in accordance with an embodiment of the present invention.

FIG. 7 depicts the process and line charges to implement the recovery process in accordance with an embodiment of the present invention.

In a scenario where the X-value is '0' and the Y-value is '1', in the starting state, the word line (such as word line 104) would be off, and the precharge (such as precharge 110) would be on and charging both bit lines (such as bit lines 106 and 108) to a '1' value. Sense (such as sense amplifier 114) would be off and both the standard access transistors to the sense amplifier (such as column select transistors 116 and 118) and the recovery transistors (such as BTIR transistors 402 and 404) would be off.

After the bit lines are charged, precharge would be deactivated and the word line would be activated. This would cause the X-valued bit line to be pulled down to 0, with the resulting bit line values being '0' and '1'. Precharge would remain off for the rest of the process. To latch the bit line values into sense amplifier 114, sense would be turned on, and the standard access transistors would be activated. Sense amplifier 114 would now be storing values X=0 and Y=1 as long as the sense remains on.

After the X- and Y-values are latched into sense amplifier 114, the word line would be turned off and the standard access transistors would be turned off. The sense transistor would remain on to keep the X- and Y-values stored in sense amplifier 114.

Next, BTIR transistors would be turned on to provide the X- and Y-values in sense amplifier 114 to the opposite bit lines. The word line would be activated again, causing the X-value from the sense amplifier ('0') to write to the Y-value of memory cell 102, and the Y-value from the sense amplifier ('1') to write to the X-value of memory cell 102. Now that the values stored in memory cell 102 have been reversed, the word line, the recovery transistors, and the sense transistor may be deactivated. The same infrastructure can be used to rewrite the original content of the cell at the end of the recovery period.

In a preferred embodiment, all memory cells enter a recovery period for at least one minute a day or according to a preferred technology-specific ratio (of recovery time to operation time) that would be sufficient to recover most of the stress. In one embodiment, sections of memory are refreshed together. For example, if there is a plurality of memory banks, each holding a plurality of memory cells, an entire memory bank may undergo the recovery process. An array keeping track of each memory bank may be implemented, storing a '1' if the bank has been accessed or a '0' if the memory bank has not been accessed. After a predefined period of time, all memory banks that have not been accessed (bit=0) are refreshed and the bit array is reset. Periodically, all memory banks may be refreshed regardless of a special bit value. Other methods for determining when to refresh a memory cell or cells may be used.

Figure 8:
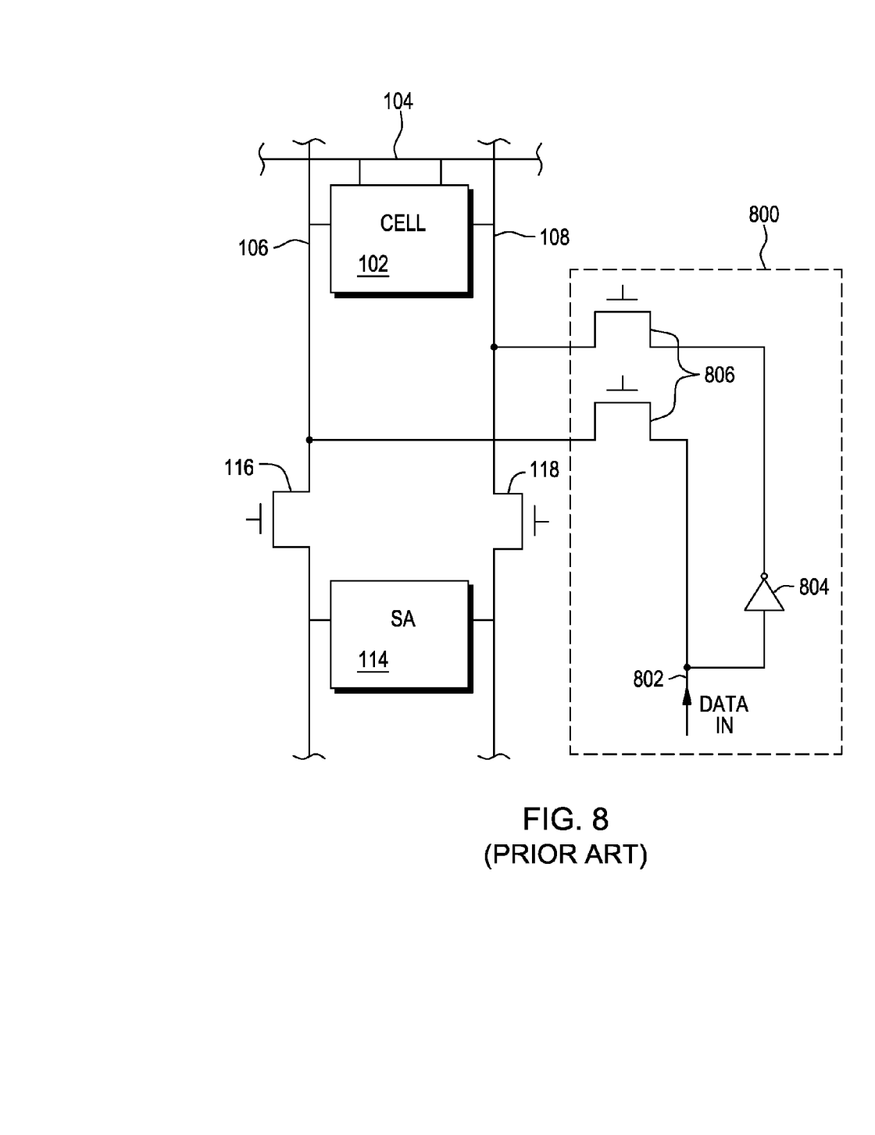
FIG. 8 illustrates a standard data driver for writing to a memory cell.

FIG. 8 illustrates a standard data driver for writing to a memory cell. As previously discussed, to write to memory cell 102, the values to be written are placed on the bit lines 106 and 108. Data driver 800 depicts a traditional method for writing an input value. A "true" logic value comes in on a single line 802. The logic value is divided to traverse two lines. One line retains the true value, while the other line uses inverter 804. The two lines access the bit lines through column select transistors 806.

Figure 9:
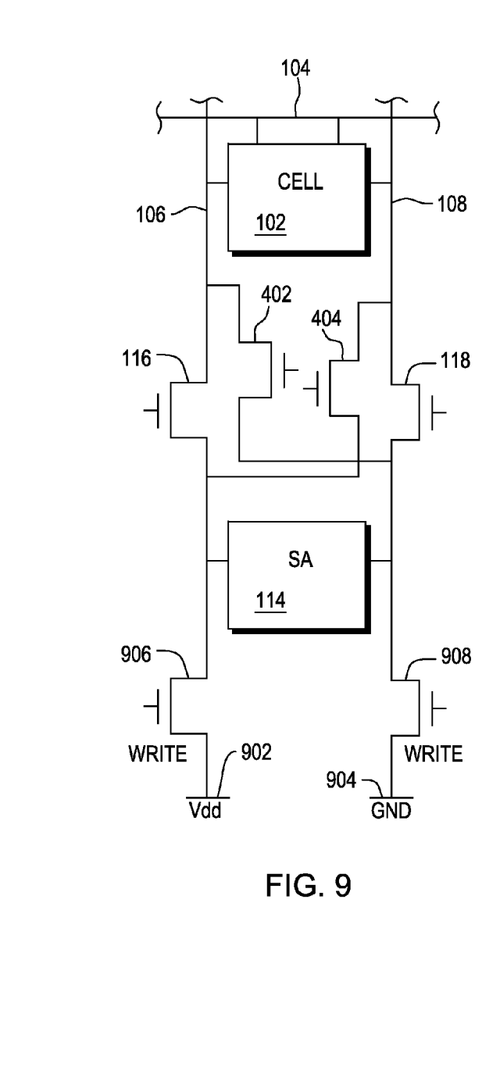
FIG. 9 demonstrates writing to a memory cell without the use of a data driver by making use of the additional circuitry of the present invention.

FIG. 9 demonstrates writing to a memory cell without the use of a data driver by making use of the additional circuitry of the present invention. In this embodiment, high logic 902 and low logic 904 access the bit lines through write transistors 906 and 908. Though the values provided by accessing write transistors 906 and 908 are fixed, any value may be written to memory cell 102 by accessing either column select transistors 116 and 118 or BTIR transistors 402 and 404 for the inverse. In the depicted embodiment, sense amplifier 114 is also connected to high logic 902 and low logic 904. In such an embodiment, sense amplifier 114 may temporarily latch the values from high logic 902 and low logic 904 and/or strengthen the signal of those values. For example, if column select transistors 116 and 118 and BTIR transistors 402 and 404 are all deactivated, sense amplifier 114 may be turned on, and write transistors 906 and 908 may be activated to latch the high and low value into sense amplifier 114. Write transistors 906 and 908 may be subsequently deactivated and the values stored in sense amplifier 114 may be written to memory cell 102 using either column select transistors 116 and 118 or BTIR transistors 402 and 404 depending on the value to be written.

Figure 10:
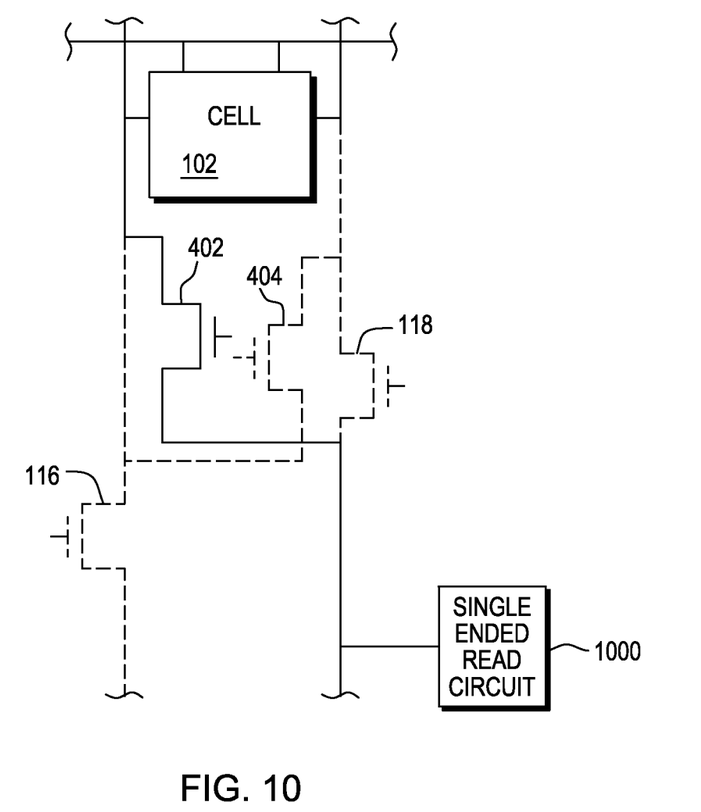
FIG. 10 depicts the use of the additional circuitry as an alternate read path in a single-ended read configuration.

FIG. 10 depicts the use of the additional circuitry as an alternate read path in a single-ended read configuration. In addition to BTI, as device size continuously scales down, the increasing leakage current, systematic process variations, and local random variation lead to a large spread in read SNM (static noise margin) and cause weak performance and/or destructive read errors at the tail of the distribution. The previously described circuitry presents an opportunity for yield improvement.

Single ended read circuit 1000 typically always reads from the same (default) side. In the depicted example, the default side is the right-hand side via column select transistor 118. If it is determined that the read delay for a cell in the column is greater than some threshold value and/or that the delay is reduced or the delay numbers on the opposite side are more tolerable, it may be desirable to rely on the opposite side of the column for the read. Though technically, a single bad cell can be read from the opposite side, the preferred embodiment reads the entire column from the opposite side. The column may be labeled as inverted, meaning that all data going in to or out of the column, will actually be going in to or out of the opposite side of the column. Column select transistor 118 is deactivated and BTIR transistor 402 is activated so that single ended read circuit 1000 may read and write to the opposite side (true data) of the inverted column. One example of a threshold value that the read-delay should stay within is a 4-sigma delay (a delay meeting or exceeding four standard deviations from the average). Typically, few columns will have cells with a delay this substantial and those columns will not typically have more than one slow cell. Flipping the read to the opposite side on these few columns helps to avoid degraded performance.

The functioning of activating, deactivating, charging and discharging circuits and devices is preferably implemented in whole or in part by computer circuits and other hardware. Alternatively, the functioning can be written in various programming languages including low-level, high-level, object-oriented or non object-oriented languages.

Based on the foregoing, an apparatus and methods have been disclosed for combating the effects of BTI and other variability in a memory cell. However, numerous modifications and substitutions can be made without deviating from the scope of the present invention. Therefore, the present invention has been disclosed by way of example and not limitation.

What is claimed is:

1. A method for extending lifetime reliability of a memory cell, the method comprising:
providing a first and second read and write (R/W) path connecting a memory cell to a sense amplifier, wherein one of the first and second R/W paths comprises a first conductive path connecting a first node of the memory cell to a first node of the sense amplifier and a second conductive path connecting a second node of the memory cell to a second node of the sense amplifier, and an other of the first and second R/W paths comprises a first conductive path connecting the first node of the memory cell to the second node of the sense amplifier and a second conductive path connecting the second node of the memory cell to the first node of the sense amplifier, wherein the respective first and second nodes of the memory cell and the sense amplifier are each capable of storing a bit value;
activating the first R/W path and precharging the first and second conductive paths of the first R/W path;
activating a word line corresponding to the memory cell to read the bit values of the first and second node of the memory cell onto the first and second conductive paths of the first R/W path;
providing a voltage to the sense amplifier to latch the bit values on the first and second conductive paths of the first R/W path into the first and second nodes of the sense amplifier;
deactivating the word line;
deactivating the first R/W path;
activating the second R/W path and reading the bit values in the first and second nodes of the sense amplifier onto the first and second conductive paths of the second R/W path; and
activating the word line to write the bit values on the first and second conductive paths of the second R/W path into the respective first and second nodes of the memory cell to enter a recovery state.

2. The method of claim 1, wherein the first and second R/W paths are activated by activating a FET coupled to each of the respective first and second conductive paths.

3. The method of claim 1, further comprising:
deactivating the word line a second time;
deactivating the second R/W path;
activating the first R/W path; and
activating the word line to write transposed bit values to the memory cell and exit the recovery state.

4. The method of claim 1, further comprising:
while in the recovery state:
in response to a read request, reading the memory cell via the other of the first and second R/W paths comprising the first and second conductive path connecting the first node of the memory cell to the second node of the sense amplifier and the second node of the memory cell to the first node of the sense amplifier, respectively.

5. The method of claim 1, further comprising:
while in the recovery state:
in response to a write request, writing to the memory cell via the other of the first and second R/W paths comprising the first and second conductive paths connecting the first node of the memory cell to the second node of the sense amplifier and the second node of the memory cell to the first node of the sense amplifier, respectively.

6. A method for writing to a memory cell, the method comprising:
providing a first and second read and write (R/W) path to a memory cell, wherein the first R/W path comprises:
a first bit line coupled to a first node of the memory cell;
a second bit line coupled to a second node of the memory cell;
a FET coupled to the first bit line that when activated provides a path from a first section of the first bit line to a second section of the first bit line;
a FET on the second bit line that when activated provides a path from a first section of the second bit line to a second section of the second bit line;
wherein the second R/W path comprises:
a first alternative conductive path connecting the first section of the first bit line to the second section of the second bit line, the first alternative conductive path being selectable by activating a FET coupled to the first alternative conductive path;
a second alternative conductive path connecting the first section of the second bit line to the second section of the first bit line, the second alternative conductive path being selectable by activating a FET coupled to the second alternative conductive path;
providing a first conductive line connecting to the second section of the first bit line and operational via a FET coupled to the first conductive line and a second conductive line connecting the second section of the second bit line and operational via a FET coupled to the second conductive line, wherein one of the first and second conductive lines accesses a high voltage when activated and an other of the first and second line accesses a low voltage when activated;
determining a logic value to be written to the memory cell;
activating the respective FETs on the first and second conductive lines;
activating one of the first and second R/W paths based on the logic value; and
activating a word line corresponding to the memory cell to write values associated with the high and low voltages into the first and second node of the memory cell.

7. The method of claim 6, further comprising:
providing a sense amplifier, wherein a first node of the sense amplifier connects to the first conductive line and a second node of the sense amplifier connects to the second conductive line;
before the step of activating one of the first and second R/W paths based on the determined logic value, activating the sense amplifier to latch in bit values associated with the high voltage and the low voltage into the first and second nodes of the sense amplifier; and
deactivating the respective FETs coupled to the first and second conductive lines.

8. A method for selectively reading a node of a memory cell in a single-ended read, the method comprising:
providing a column of one or more memory cells, each respective memory cell comprising a first and second node, each of the first and second nodes maintaining an opposite bit value;
providing a bit line connecting each respective first node to a single-ended sense amplifier, the bit line being accessible via a FET coupled to the bit line;
providing an alternate conductive path connecting each respective second node of the one or more memory cells to the single-ended sense amplifier, the alternate conductive path being accessible via a FET coupled to the alternate conductive path;
determining a read delay for each of the respective first nodes; and
if, for a given node from the respective first nodes, the read delay is greater than a threshold read delay, performing subsequent read and write requests via the alternate conductive path.

9. The method of claim 8, wherein the subsequent read and write requests are any read and write requests for every memory cell in the column.

10. The method of claim 8, wherein the threshold read delay is a predefined standard deviation.

11. The method of claim 10, wherein the predefined standard deviation is four sigma.

* * * * *